United States Patent
Kim et al.

(10) Patent No.: US 9,202,806 B2
(45) Date of Patent: Dec. 1, 2015

(54) LIGHT EMITTING DEVICE PACKAGE

(75) Inventors: Byungmok Kim, Seoul (KR); Sujung Jung, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 671 days.

(21) Appl. No.: 13/428,564

(22) Filed: Mar. 23, 2012

(65) Prior Publication Data

US 2012/0241806 A1  Sep. 27, 2012

(30) Foreign Application Priority Data

Mar. 25, 2011  (KR) .................. 10-2011-0026979

(51) Int. Cl.
| | |
|---|---|
| H01L 33/00 | (2010.01) |
| H01L 25/16 | (2006.01) |
| F21K 99/00 | (2010.01) |
| F21Y 101/02 | (2006.01) |
| H01L 33/62 | (2010.01) |

(52) U.S. Cl.
CPC .............. *H01L 25/167* (2013.01); *F21K 9/17* (2013.01); *F21Y 2101/02* (2013.01); *H01L 33/62* (2013.01); *H01L 2224/73265* (2013.01)

(58) Field of Classification Search
CPC . H01L 25/167; H01L 33/62; H01L 23/49537; H01L 23/49861; H01L 25/042; H01L 25/0652; H01L 25/0655; H01L 25/071; H01L 25/072; H01L 25/0753
USPC ......... 257/99, 79, 84, 98, 666, 672, 673, 676, 257/784, 678, 690, 734, 778, 782, 783
See application file for complete search history.

(56) References Cited

U.S. PATENT DOCUMENTS

| | | | |
|---|---|---|---|
| 8,633,643 B2* | 1/2014 | Lee et al. ............... | 313/498 |
| 2003/0122139 A1* | 7/2003 | Meng et al. ............ | 257/81 |
| 2010/0032709 A1* | 2/2010 | Huang et al. ........... | 257/99 |
| 2011/0186886 A1* | 8/2011 | Watari et al. ........... | 257/98 |
| 2013/0001599 A1* | 1/2013 | Lee ......................... | 257/88 |
| 2013/0037842 A1* | 2/2013 | Yamada et al. ......... | 257/98 |

* cited by examiner

*Primary Examiner* — Thanh Y Tran
(74) *Attorney, Agent, or Firm* — Birch, Stewart, Kolasch & Birch, LLP

(57) ABSTRACT

Disclosed is a light emitting device package. The light emitting device package includes a Zener diode, a light emitting device including a light emitting diode, a body including lead frames on which the light emitting device and the Zener diode are disposed, and provided with a cavity formed on the lead frames, a first adhesive member disposed between the Zener diode and the lead frames, and a second adhesive member disposed between the light emitting device and the lead frames, and the thickness of the second adhesive member is equal to or less than the thickness of the first adhesive member.

20 Claims, 9 Drawing Sheets

LIGHT EMITTING DEVICE PACKAGE

CROSS-REFERENCE TO RELATED APPLICATION

This application claims the priority benefit of Korean Patent Application No. 10-2011-0026979, filed on Mar. 25, 2011 in the Korean Intellectual Property Office, the disclosure of which is incorporated herein by reference.

BACKGROUND

1. Field

Embodiments relate to a light emitting device package.

2. Description of the Related Art

As one representative example of light emitting devices, light emitting diodes (LEDs) are devices which convert an electrical signal into light, such as infrared light or visible light, using characteristics of a compound semiconductor, and are used in household electric appliances, remote controllers, electronic bulletin boards, displays, various automated machines, etc., and the application range of the LEDs continues to expand.

In general, a small LED is fabricated into a surface mount device type in order to be directly mounted on a printed circuit board (PCB), and thus an LED lamp used as a display device is developed into a surface mount device type. Such a surface mount device may substitute for conventional lamps, and may be used in a light-on/off display producing various colors, a letter indicator, an image display, etc.

As the application range of the LEDs continues to expand, as described above, brightness required by an electric lamp used in daily life, an emergency signal lamp, etc. is increased, and thus increase of brightness of light emitted from the LEDs becomes an issue.

SUMMARY

Embodiments provide a light emitting device package.

In one embodiment, a light emitting device package includes a Zener diode, a light emitting device including a light emitting diode, a body including lead frames on which the light emitting device and the Zener diode are disposed, and provided with a cavity formed on the lead frames, a first adhesive member disposed between the Zener diode and the lead frames, and a second adhesive member disposed between the light emitting device and the lead frames, wherein the thickness of the second adhesive member is equal to or less than the thickness of the first adhesive member.

In another embodiment, a light emitting device array includes light emitting device packages, each of which includes a Zener diode, a light emitting device including a light emitting diode, a body including lead frames on which the light emitting device and the Zener diode are disposed and provided with a cavity formed on the lead frames, a first adhesive member disposed between the Zener diode and the lead frames, and a second adhesive member disposed between the light emitting device and the lead frames, and a substrate disposed on the light emitting device packages, wherein the thickness of the second adhesive member is equal to or less than the thickness of the first adhesive member.

In a further embodiment, a lighting system includes a light emitting device array including light emitting device packages, and a substrate on which the light emitting device packages are disposed, each of the light emitting device packages including a Zener diode, a light emitting device including a light emitting diode, a body including lead frames on which the light emitting device and the Zener diode are disposed and provided with a cavity formed on the lead frames, a first adhesive member disposed between the Zener diode and the lead frames, and a second adhesive member disposed between the light emitting device and the lead frames, a optical member disposed adjacent to the light emitting device array, wherein the thickness of the second adhesive member is equal to or less than the thickness of the first adhesive member.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
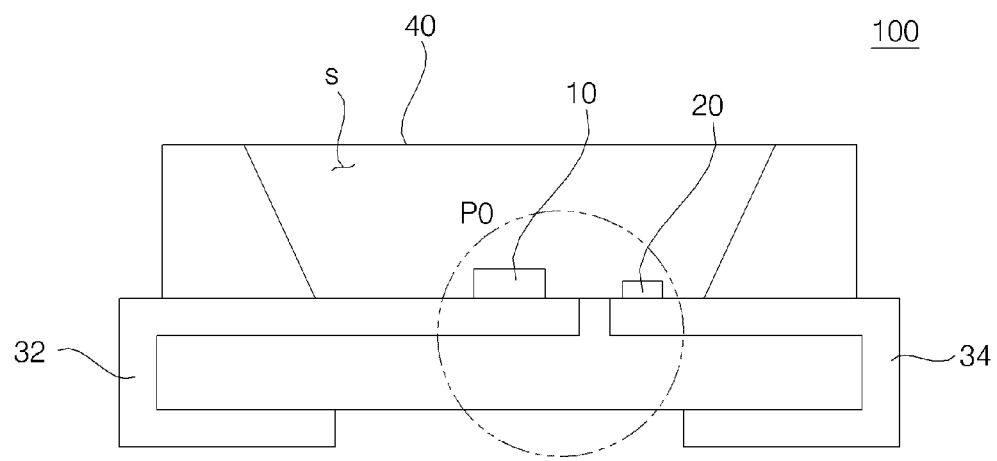
FIG. 1 is a cross-sectional view of a light emitting device package in accordance with a first embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
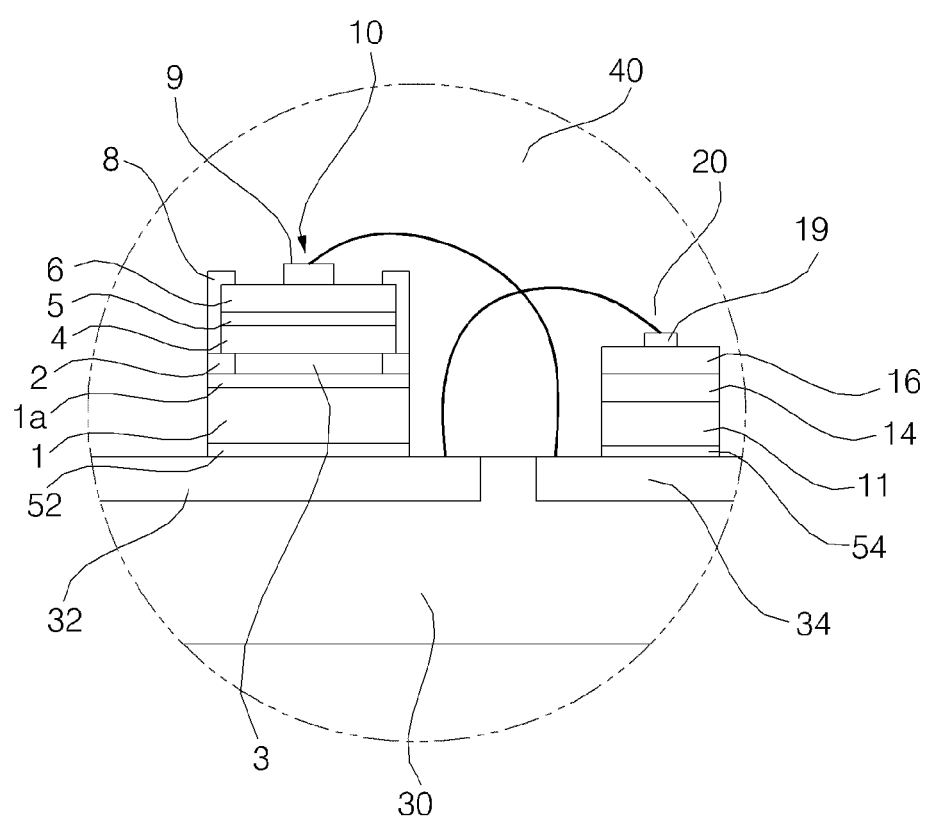
FIG. 2 is an enlarged view of the portion 'P0' of the light emitting device package shown in FIG. 1.

FIG. 1 is a cross-sectional view of a light emitting device package in accordance with a first embodiment, and FIG. 2 is an enlarged view of the portion 'P0' of the light emitting device package shown in FIG. 1.

With reference to FIGS. 1 and 2, a light emitting device package 100 may include a light emitting device 10 including a light emitting diode, a Zener diode 20, and a body 30 on which the light emitting device 10 and the Zener diode 20 are disposed.

The body 30 may be formed of at least one selected from among the group consisting of a resin, such as polyphthalamide (PPA), silicon (Si), aluminum (Al), aluminum nitride (AlN), $AlO_x$, photo sensitive glass (PSG), polyamide 9T (PA9T), syndiotactic polystyrene (SPS), a metal, sapphire ($Al_2O_3$), beryllium oxide (BeO, ceramic and a printed circuit board (PCB).

The body 30 may be formed through injection molding, etching, etc., but the disclosure is not limited thereto.

The upper surface of the body 30 may have various shapes, such as a triangle, a rectangle, a polygon and a circle, according to purpose and design, but the disclosure is not limited thereto.

The body 30 is provided with a cavity s in which the light emitting device 10 and the Zener diode 20 are disposed, the cavity s may have various cross-sectional shapes, such as a cup, a concave container, etc., and the inner surface of the body 30 forming the cavity s may be inclined in the downward direction.

Further, the cavity s may have various planar shapes, such as a circle, a rectangle, a polygon and an oval, but the disclosure is not limited thereto.

Lead frames including first and second lead frames 32 and 34 may be disposed on the lower surface of the body 30, and the first and second lead frames 32 and 34 may be formed of a metal, for example, at least one selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof.

Further, the first and second lead frames 32 and 34 may be formed to have a single layer structure or a multi-layer structure, but the disclosure is not limited thereto.

The inner surface of the body 30 may be inclined at a designated inclination angle from one of the first and second lead frames 32 and 34, the angle of reflection of light emitted from the light emitting device 10 may be varied according to the inclination angle, and thereby, the orientation angle of light emitted to the outside may be adjusted. As the orientation angle of light decreases, convergence of light emitted from the light emitting device 10 to the outside increases, and on the other hand, as the orientation angle of light increases, convergence of light emitted from the light emitting device 10 to the outside decreases.

The inner surface of the body 30 may have plural inclination angles, but the disclosure is not limited thereto.

The first and second lead frames 32 and 34 are electrically connected to the light emitting device 10 and the Zener diode 20, and are connected to an anode and a cathode of an external power supply (not shown) so that power may be supplied to at least one of the light emitting device 10 and the Zener diode 20.

In this embodiment, the light emitting device 10 is disposed on the first lead frame 32, the Zener diode 20 is disposed on the second lead frame 34, and the light emitting device 10 and the Zener diode 20 are respectively die-bonded to the first and second lead frames 32 and 34, wire-bonded to the second and first lead frames 34 and 32, and receive power from the first and second lead frames 32 and 34.

Here, the light emitting device 10 and the Zener diode 20 may be bonded to the first lead frame 32 and the second lead frame 34 with different polarities so as to be connected in parallel.

Further, the light emitting device 10 may be respectively wire-bonded or die-bonded to the first and second lead frames 32 and 34 and the Zener diode 20 may be wire-bonded to the first and second lead frames 32 and 34, but the disclosure is not limited thereto.

Although this embodiment illustrates the light emitting device 10 and the Zener diode 20 as being separately disposed on the first and second lead frames 32 and 34, both the light emitting device 10 and the Zener diode 20 may be disposed on the first lead frame 32 or the second lead frame 34, but the disclosure is not limited thereto.

Further, the light emitting device 10 and the Zener diode 20 may be adhered to the first and second lead frames 32 and 34 by adhesive members (not shown), and a detailed description of the adhesive members will be given later.

A cathode mark (not shown) may be formed on the body 30. The cathode mark may serve to identify the polarity of the light emitting device 10, i.e., the polarities of the first and second lead frames 32 and 34 to prevent confusion when the first and second lead frames 32 and 34 are electrically connected.

The light emitting device 10 may be a light emitting diode. For example, such a light emitting diode may be a light emitting diode which emits red, green, blue or white light, or an ultraviolet light emitting diode which emits ultraviolet light, but the disclosure is not limited thereto. Further, plural light emitting devices 10 may be mounted on the first lead frame 32, or at least one light emitting device 10 may be mounted on each of the first and second lead frames 32 and 34, but the disclosure is not limited as to the number of the light emitting devices 10 and the mounting positions of the light emitting devices 10.

The body 30 may include a resin material 40 filling the cavity s. That is, the resin material 40 may be formed in a double molding structure or a triple molding structure, but the disclosure is not limited thereto.

Further, the resin material 40 may be formed in a film type, may include at least one of phosphors and a light diffusing agent, and may use a light-transmitting material excluding phosphors and a light diffusing agent, but the disclosure is not limited thereto.

As shown in FIG. 2, the light emitting device 10 is of a vertical type, and may include a support member 1 and a light emitting structure 7 disposed on the support member 1 and including a first semiconductor layer 4, a second semiconductor layer 6 and an active layer 5 interposed between the first and second semiconductor layers 4 and 6.

Here, the support member 1 may be formed of a material having high thermal conductivity or an electrical conductive material.

The support member 1 may be formed in a single layer structure, a double layer structure or a multi-layer structure, but the disclosure is not limited thereto.

Further, the support member 1 may be formed of gold (Au), nickel (Ni), tungsten (W), molybdenum (Mo), copper (Cu), copper-tungsten (CU—W), or a carrier wafer.

Here, the carrier wafer may be formed of Si, Ge, GaAs, ZnO, SiC, SiGe, GaN, or $Ga_2O_3$.

The support member 1 may facilitate discharge of heat generated by the light emitting device 10 to improve thermal stability of the light emitting device 10.

A conductive layer 1a may be formed on the support member 1. The conductive layer 1a may be formed to minimize electromigration in which atoms of a first electrode 3 move by an electric field during application of current.

Further, the conductive layer 1a may be formed of a metal having high adhesiveness with the support member 1, and may be formed of a barrier metal or a bonding metal, for example, at least one selected from the group consisting of Ti, Au, Sn, Ni, Cr, Ga, In, Bi, Cu, Ag and Ta, but the disclosure is not limited thereto.

The conductive layer 1a may be formed to have plural layers formed of different metals and bonded to one another, but the disclosure is not limited thereto.

The first electrode 3 and a channel layer 2 contacting the side surface of the first electrode 3 may be formed on the conductive layer 1a.

Here, the channel layer 2 may include at least one of a metal and an insulating material, and if the channel layer is formed of a metal, a metal having lower electrical conductivity than the material of the first electrode 3 may be used so as to prevent power applied to the first electrode 3 from being applied to the channel layer 2.

The first electrode 3 may include at least one of a reflective layer (not shown) and a light transmitting electrode layer (not shown), and the reflective layer and the light transmitting electrode layer may be formed through a co-firing process and have excellent adhesive force.

The reflective layer may be formed in one layer or plural layers of at least one selected from the group, consisting of Ag, Ni, Al, Rh, Pd, Ir, Ru, Mg, Zn, Pt, Au and Hf, and an alloy including at least two thereof, but the disclosure is not limited thereto.

Further, the light transmitting electrode layer may be formed of at least one selected from the group consisting of Ni, Pt, Ru, Ir, Rh, Ta, Mo, Ti, Ag, W, Cu, Cr, Pd, V, Co, Nb and Zr, or at least one of ITO and ZnO.

The light emitting structure 7 may be formed on the channel layer 2 and the first electrode 3.

The first semiconductor layer 4 may be a P-type semiconductor layer, and may inject holes into the active layer 5. The first semiconductor layer 4 may be formed of a semiconductor material having a formula of $In_xAl_yGa_{(1-x-y)}N$ ($0 \leq x \leq 1$, $0 \leq y \leq 1$ $0 \leq x+y \leq 1$), for example, at least one selected from the group consisting of GaN, AlN, AlGaN, InGaN, InN, InAlGaN and AlInN, and may be doped with a P-type dopant, such as Mg, Zn, Ca, Sr or Ba.

The active layer 5 may be formed on the upper surface of the first semiconductor layer 4.

The active layer 5 may be formed in a single quantum well structure, a multi-quantum well (MQW) structure, a quantum wire structure or a quantum dot structure using a group III-V compound semiconductor material.

If the active layer 5 is formed in a quantum well structure, the active layer 5 may be formed in a single quantum well structure or a multi-quantum well structure including a well layer having a formula of $In_xAl_yGa_{1-x-y}N$ ($0 \leq x \leq 1$, $0 \leq y \leq 1$ $0 \leq x+y \leq 1$) and a barrier layer having a formula of $In_aAl_bGa_{1-a-b}N$ ($0 \leq a \leq 1$, $0 \leq b \leq 1$ $0 \leq a+b \leq 1$). The well layer may be formed of a material having a lower band gap than the band gap of the barrier layer.

A conductive clad layer may be formed on the upper surface and/or the lower surface of the active layer 5. The conductive clad layer may be formed of an AlGaN-based semiconductor and have a higher band gap than the band gap of the active layer 5.

The second semiconductor layer 6 may be formed on the upper surface of the active layer 5.

The second semiconductor layer 6 may be an N-type semiconductor layer. The second semiconductor layer 6 may be formed of a semiconductor material having a formula of $In_xAl_yGa_{(1-x-y)}N$ ($0 \leq x \leq 1$, $0 \leq y \leq 1$ $0 \leq x+y \leq 1$), for example, at least one selected from the group consisting of InAlGaN, GaN, AlGaN, InGaN, AlN, InN and AlInN, and may be doped with an N-type dopant, such as Si, Ge or Sn.

Further, a passivation layer 8 insulating the first and second semiconductor layers 4 and 6 and the active layer 5 from one another may be formed on the side surface of the light emitting structure 7.

The passivation layer 8 may serve to achieve insulation between the first and second semiconductor layers 4 and 6 and the active layer 5 and to prevent corrosion due to moisture and foreign substrates introduced from the outside.

A second electrode 9 may be formed on the upper surface of the light emitting structure 7, i.e., the upper surface of the second semiconductor layer 6. The second electrode 9 may be formed of the same material as the first electrode 2, but the disclosure is not limited thereto.

Here, the second electrode 9 may be wire-bonded (not shown) to the second lead frame 34, the support member 1 may be adhered and fixed to the first lead frame 32 by a first adhesive member 52, and thus the first electrode 3 may be electrically connected to the first lead frame 32.

The Zener diode 20 may include a Zener substrate 11, a first semiconductor layer 14, a second semiconductor layer 16, and a third electrode 19 provided on the second semiconductor layer 16.

Here, the Zener substrate 11 may be formed of the same material as the support member 1, but the disclosure is not limited thereto.

The first and second semiconductor layers 14 and 16 may be formed of the same materials as the first and second semiconductor layers 4 and 6 of the light emitting device 10 and the third electrode 19 may be formed of the same material as one of the first and second electrodes 3 and 9, but the disclosure is not limited thereto.

Here, the Zener substrate 11 of the Zener diode 20 may be adhered and fixed to the second lead frame 34 by a second adhesive member 54, and the third electrode 19 may be wire-bonded to the first lead frame 32 and thus be connected to the light emitting device 10 in parallel.

That is, the Zener diode 20 is electrically disconnected, if forward voltage is supplied from the first lead frame 32 to the second lead frame 34, and is electrically shorted and passes backward voltage, if backward voltage is supplied from the second lead frame 34 to the first lead frame 32, thereby preventing damage to the light emitting device 10.

Here, the first and second adhesive members 52 and 54 may be formed of the same conductive material, and may include at least one of gold (Au) and gold-tin (AuSn).

The thickness of the first adhesive member 52 may be equal to or less than the thickness of the second adhesive member 54, but the disclosure is not limited thereto.

FIGS. 1 and 2 illustrate the light emitting device package 100 having a general shape, and the light emitting device package 100 may be configured such that the first and second lead frames 32 and 34 surround the body 30.

Figure 3:
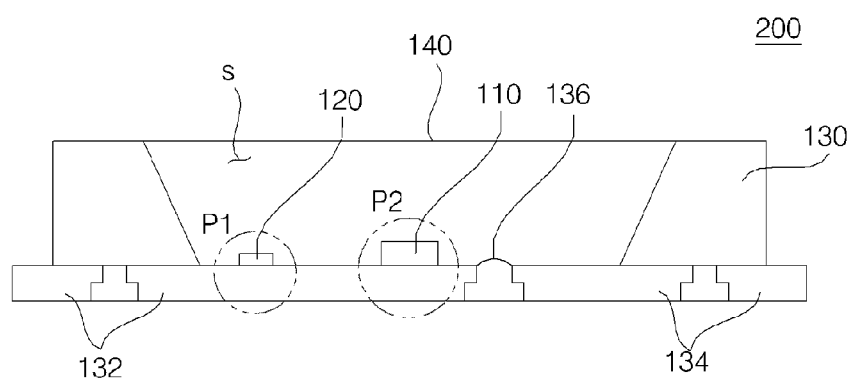
FIG. 3 is a cross-sectional view of a light emitting device package in accordance with a second embodiment.

FIG. 3 is a cross-sectional view of a light emitting device package in accordance with a second embodiment. With reference to FIG. 3, a light emitting device package 200 may include a light emitting device 110, a Zener diode 120, and a body 130 on which the light emitting device 110 and the Zener diode 120 are disposed.

The body 130 may be formed of at least one selected from among the group consisting of a resin, such as polyphthalamide (PPA), silicon (Si), aluminum (Al), aluminum nitride (AlN), AlO$_x$, photo sensitive glass (PSG), polyamide 9T (PA9T), syndiotactic polystyrene (SPS), a metal, sapphire (Al$_2$O$_3$), beryllium oxide (BeO), ceramic and a printed circuit board (PCB).

The body 130 may be formed through injection molding, etching, etc., but the disclosure is not limited thereto.

The upper surface of the body 310 may have various shapes, such as a triangle, a rectangle, a polygon and a circle, according to purpose and design, but the disclosure is not limited thereto.

The body 130 is provided with a cavity s in which the light emitting device 110 and the Zener diode 120 are disposed, the cavity s may have various cross-sectional shapes, such as a cup, a concave container, etc., and the inner surface of the body 130 forming the cavity s may be inclined in the downward direction.

Further, the cavity s may have various planar shapes, such as a circle, a rectangle, a polygon and an oval, but the disclosure is not limited thereto.

Lead frames including first and second lead frames 132 and 314 may be disposed on the lower surface of the body 130, and the first and second lead frames 132 and 134 may be formed of a metal, for example, at least one selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof.

Further, the first and second lead frames 132 and 134 may be formed to have a single layer structure or a multi-layer structure, but the disclosure is not limited thereto.

The inner surface of the body 130 may be inclined at a designated inclination angle from one of the first and second lead frames 32 and 34, the angle of reflection of light emitted from the light emitting device 110 may be varied according to the inclination angle, and thereby, the orientation angle of light emitted to the outside may be adjusted. As the orientation angle of light decreases, convergence of light emitted from the light emitting device 110 to the outside increases, and on the other hand, as the orientation angle of light increases, convergence of light emitted from the light emitting device 110 to the outside decreases.

The inner surface of the body 130 may have plural inclination angles, but the disclosure is not limited thereto.

The first and second lead frames 132 and 134 are electrically connected to the light emitting device 110, and are connected to an anode and a cathode of an external power supply (not shown) so as to supply power to the light emitting device 110.

An insulating film 136 to prevent an electrical short between the first and second lead frames 132 and 134 may be formed between the first and second lead frames 132 and 134.

In this embodiment, the light emitting device 110 and the Zener diode 120 are mounted on the first lead frame 132, are die-bonded to the first lead frame 132, are wire-bonded to the second lead frame 134 through wires (not shown), and receive power from the first and second lead frames 132 and 134.

Here, the light emitting device 110 and the Zener diode 120 may be bonded to the first lead frame 132 and the second lead frame 134 with different polarities so as to be connected in parallel.

Further, the light emitting device 110 may be respectively wire-bonded or die-bonded to the first and second lead frames 132 and 134 and the Zener diode 120 may be wire-bonded to the first and second lead frames 132 and 134, but the disclosure is not limited thereto.

Although this embodiment illustrates the light emitting device 110 and the Zener diode 120 as being disposed on the first lead frame 132, the light emitting device 110 may be disposed on the first lead frame 132 and the Zener diode 120 may be disposed on the second lead frame 134, but the disclosure is not limited thereto.

Further, the light emitting device 110 and the Zener diode 120 may be adhered to the first lead frame 132 by adhesive members (not shown), and a detailed description of the adhesive members will be given later.

A cathode mark (not shown) may be formed on the body 130. The cathode mark may serve to identify the polarity of the light emitting device 110, i.e., the polarities of the first and second lead frames 132 and 134 to prevent confusion when the first and second lead frames 132 and 134 are electrically connected.

The light emitting device 110 may be a light emitting diode. For example, such a light emitting diode may be a light emitting diode which emits red, green, blue or white light, or an ultraviolet light emitting diode which emits ultraviolet light, but the disclosure is not limited thereto. Further, plural light emitting devices 110 may be mounted on the first lead frame 132, or at least one light emitting device 110 may be mounted on each of the first and second lead frames 132 and 134, but the disclosure is not limited as to the number of the light emitting devices 110 and the mounting positions of the light emitting devices 110.

The body 130 may include a resin material 140 filling the cavity s. That is, the resin material 140 may be formed in a double molding structure or a triple molding structure, but the disclosure is not limited thereto.

Further, the resin material 140 may be formed in a film type, may include at least one of phosphors and a light diffusing agent, and may use a light-transmitting material excluding phosphors and a light diffusing agent, but the disclosure is not limited thereto.

Figure 4:
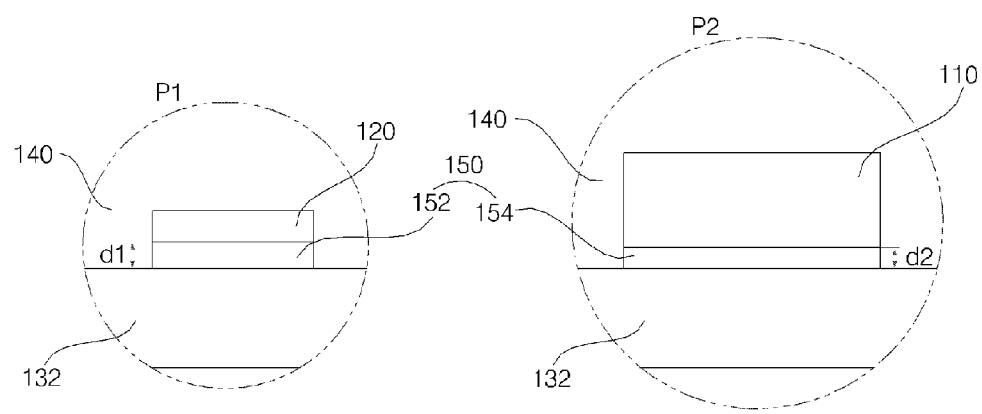
FIG. 4 is an enlarged view of the portions 'P1' and 'P2' of the light emitting device package shown in FIG. 3.

FIG. 4 is an enlarged view of the portions 'P1' and 'P2' of the light emitting device package shown in FIG. 3.

With reference to FIG. 4, the portions 'P1' and 'P2' will be described simultaneously.

As shown in FIG. 4, in the light emitting device package 200, the light emitting device 110 and the Zener diode 120 may be disposed on the first lead frame 132.

Adhesive members 150 may be disposed between the light emitting device 110 and the first lead frame 132 and between the Zener diode 120 and the first lead frame 132.

The adhesive members 150 may adhere the light emitting device 110 and the Zener diode 120 to the first lead frame 132.

Here, the adhesive members 150 may include a first adhesive member 152 having a first thickness d1 and disposed between the Zener diode 120 and the first lead frame 132, and a second adhesive member 154 having a second thickness d2 and disposed between the light emitting device 110 and the first lead frame 132.

The first thickness d1 may be a distance between the first lead frame 132 and the Zener diode 120, and the second thickness d2 may be a distance between the first lead frame 132 and the light emitting device 110.

Further, the first and second adhesive members 152 and 154 may be formed of the same material, and particularly, of a conductive material, i.e., at least one of gold (Au) and gold-tin (AuSn), but the disclosure is not limited thereto.

The second thickness d2 may be equal to or less than the first thickness d1. That is, the first thickness d1 may be varied according to the size and weight of the Zener diode 120, the second thickness d2 may be varied according to the size and weight of the light emitting device 110, and in general, the Zener diode 120 may be smaller and lighter than the light emitting device 110.

That is, the second thickness d2 may be 0.5 to 1 times the first thickness d1.

If the second thickness d2 is less than 0.5 times the first thickness d1, the possibility of electrical contact between the light emitting device 110 and the first lead frame 132 may be lowered, and if the second thickness d2 exceeds 1 times the first thickness, electrical contact between the light emitting device 110 and the first lead frame 132 may be improved but manufacturing costs may be increased.

Further, the first and second adhesive members 152 and 154 are disposed at adhesion positions before adhesion of the light emitting device 110 and the Zener diode 120 to the first lead frame 132 during a fabrication process of the light emitting device package 200, and the light emitting device 110 and the Zener diode 120 may be adhered to the first lead frame 132 under the condition that the first and second adhesive members 152 and 154 are melted by applying heat when the light emitting device 110 and the Zener diode 120 are adhered to the first lead frame 132.

Here, the first and second adhesive members 152 and 154 are formed through a single process and thus steps of the fabrication process are reduced, and the first and second adhesive members 152 and 154 are formed of the same material and thus manufacturing costs may be reduced.

Here, the widths (not shown) of the first and second adhesive members 152 and 154 may be greater than the widths (not shown) of the Zener diode 120 and the light emitting device 110, but the disclosure is not limited thereto.

That is, the widths of the first and second adhesive members 152 and 154 may be further increased by force applied in the downward when the Zener diode 120 and the light emitting device 110 are adhered to the first lead frame 132, and thereby the first and second adhesive members 152 and 154 may contact at least one side surface of each of the Zener diode 120 and the light emitting device 110, but the disclosure is not limited thereto.

The light emitting device package 200 shown in FIG. 3 and FIG. 4 is of a slug type, and is configured such that the first and second lead frames 132 and 134 support the body 130.

Figure 5:
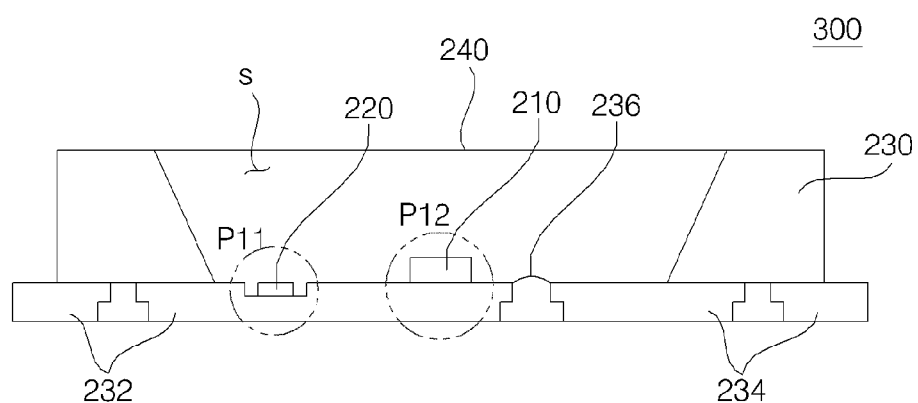
FIG. 5 is a cross-sectional view of a light emitting device package in accordance with a third embodiment.
Figure 6:
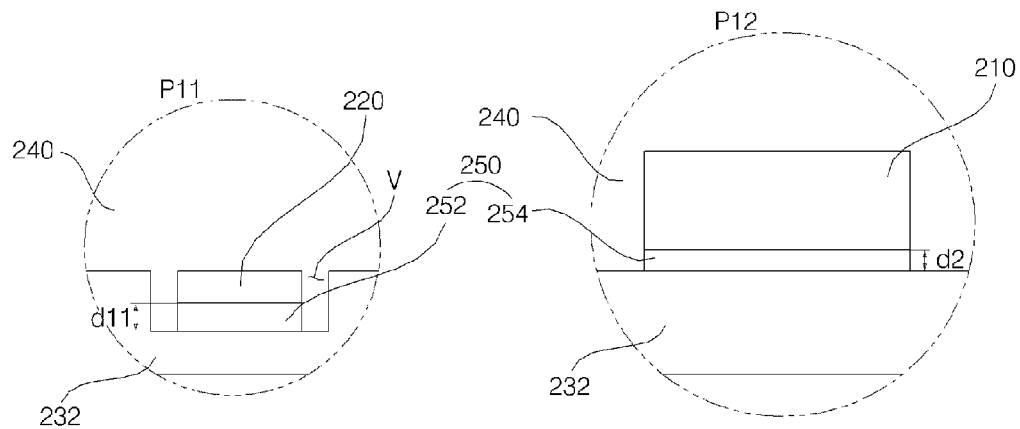
FIG. 6 is an enlarged view of the portions 'P11' and 'P12' of the light emitting device package shown in FIG. 5.

FIG. 5 is a cross-sectional view of a light emitting device package in accordance with a third embodiment, and FIG. 6 is an enlarged view of the portions 'P11' and 'P12' of the light emitting device package shown in FIG. 5.

Here, a description of components of FIG. 5 which are substantially the same as those of FIG. 3 will be omitted or given in brief.

With reference to FIG. 5 and FIG. 6, a light emitting device package 300 may include a light emitting device 210, a Zener diode 220, and a body 230.

The body 230 may include lead frames including first and second lead frames 232 and 234. The first and second lead frames 232 and 234 and the body 230 are substantially the same as the first and second lead frames 132 and 134 and the body 130 of FIG. 1, and a detailed description thereof will thus be omitted.

If a recess is formed on the second lead frame 234, the depth of the recess may be 0.3 to 0.8 times the thickness of the light emitting device 210.

That is, the depth of the recess may be formed at a lower position than an active layer of the light emitting device 210, thereby preventing light emitted from the light emitting device 210 from being absorbed by the inner surface of the recess.

With reference to FIG. 5 and FIG. 6, a recess V may be formed on the first lead frame 232 on which the Zener diode 220 is disposed from among the first and second lead frames 232 and 234.

In accordance with this embodiment, the Zener diode 220 disposed within the recess V of the first lead frame 232 does not absorb light emitted from the light emitting device 210, thereby improving light efficiency of the light emitting device package 300.

Although this embodiment illustrates the Zener diode 220 as being disposed on the first lead frame 232, the Zener diode 220 may be formed on the body 230 and be disposed in a cavity (not shown) differing from a cavity s in which the light emitting device 210 is disposed, but the disclosure is not limited thereto.

The depth of the recess V may be 1 to 2 times the thickness of the Zener diode 220. If the depth of the recess V is less than 1 times the thickness of the Zener diode 220, the Zener diode 220 may absorb light emitted from the light emitting device 210 and thus light loss may be generated, and if the depth of the recess V exceeds 2 times the thickness of the Zener diode 220, the thickness of the first lead frame 232 may be increased or stiffness of the first lead frame 132 may be reduced and thus the possibility of disconnection of the first lead frame 132 may be increased.

Further, a resin material 240 filling the cavity s and an insulating film 236 are substantially the same as those of FIG. 3, and a detailed description thereof will thus be omitted.

The light emitting devices 110 and 210 shown in FIGS. 3 to 6, may be vertical type light emitting devices in the same manner as the light emitting device 10 shown in FIG. 2 or be horizontal type light emitting devices, but the disclosure is not limited thereto.

Further, the Zener diodes 20, 120 and 220 may be formed in a structure differing from the structure in the embodiments and may have any structure with a constant voltage device passing backward voltage, but the disclosure is not limited thereto.

Figure 7:
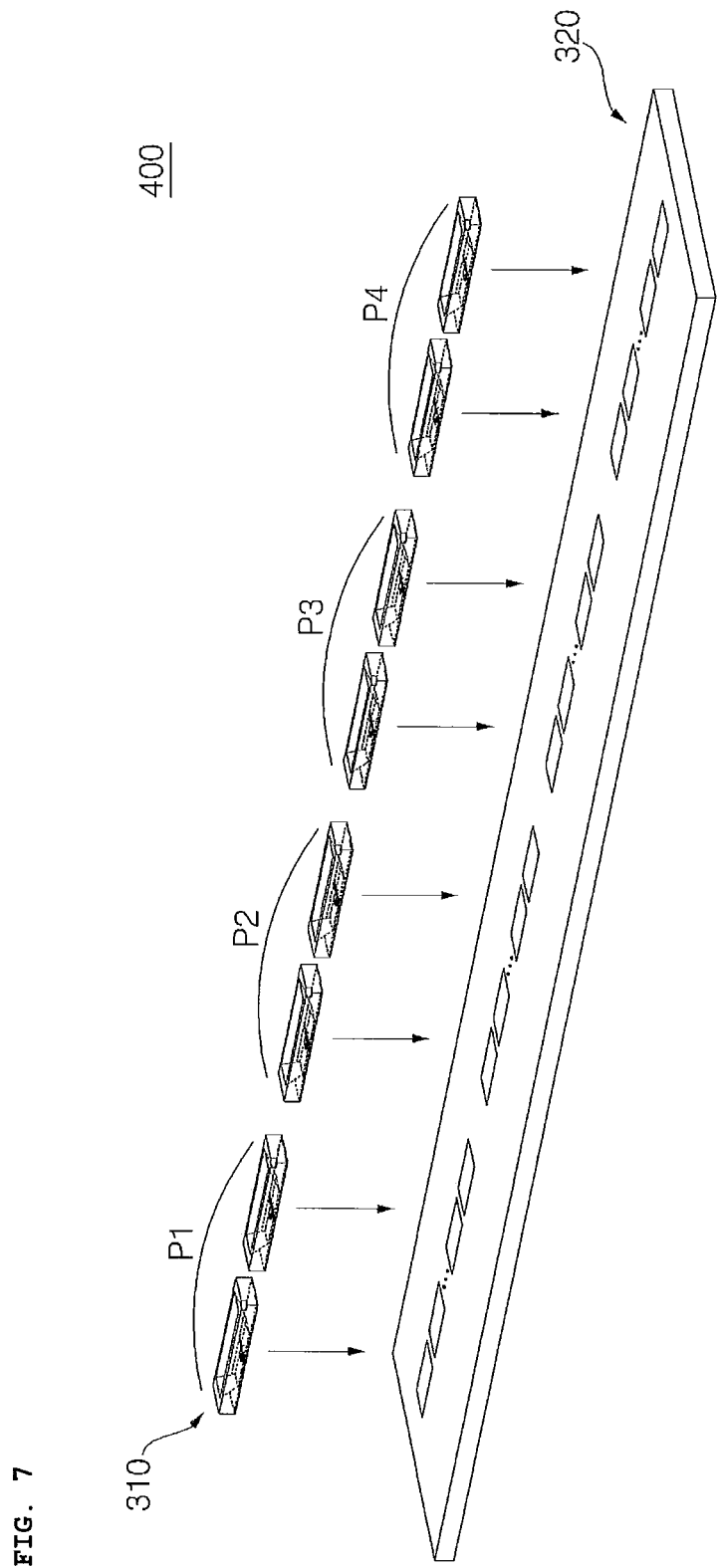
FIG. 7 is an exploded perspective view of a light emitting device array including light emitting device packages in accordance with one embodiment.
Figure 8:
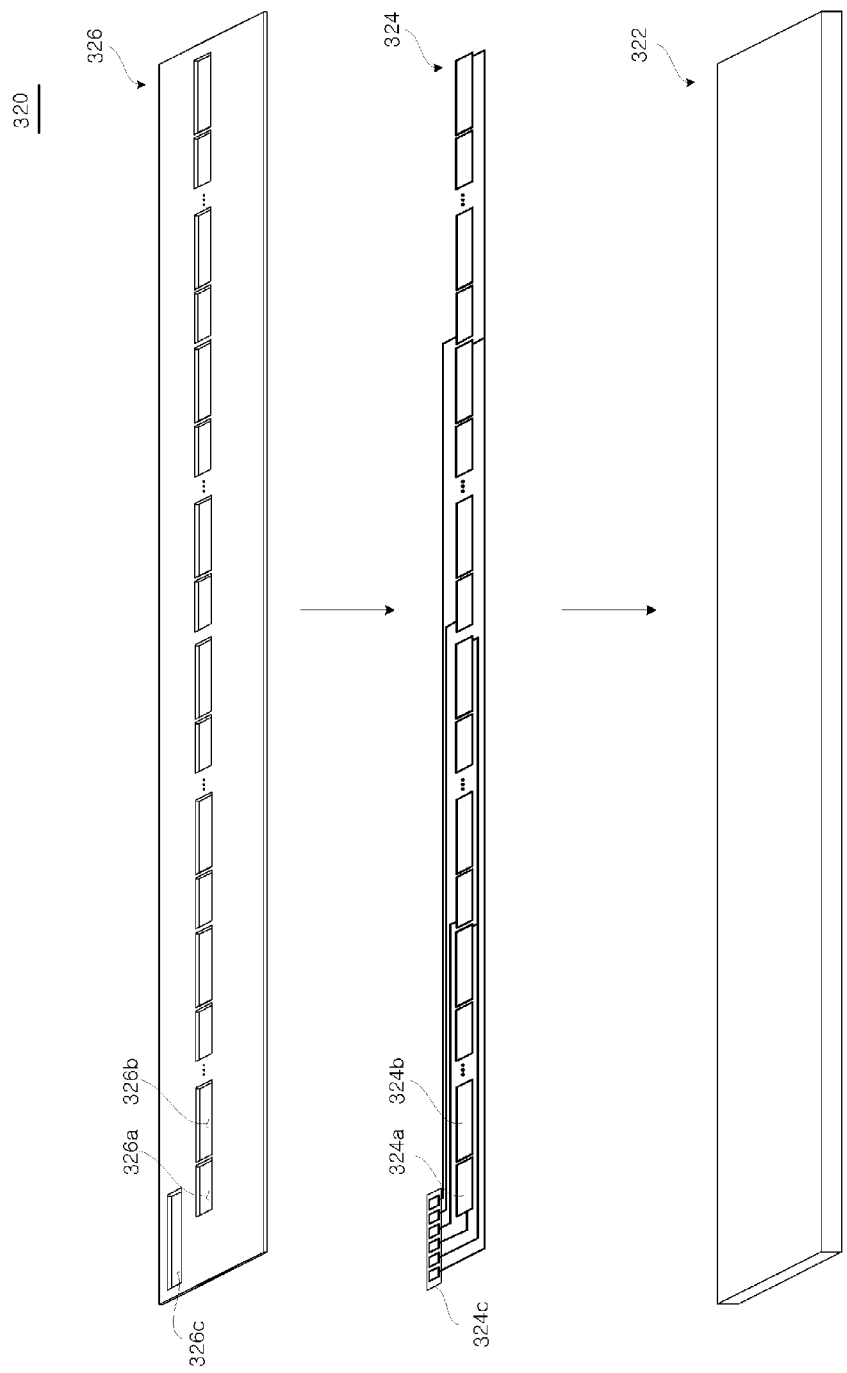
FIG. 8 is an exploded perspective view of an example of a substrate shown in FIG. 7.

FIG. 7 is an exploded perspective view of a light emitting device array including light emitting device packages in accordance with one embodiment, and FIG. 8 is an exploded perspective view of an example of a substrate shown in FIG. 7.

With reference to FIG. 7, a light emitting device array 400 may include light emitting device packages 310, and a substrate 320 on which the light emitting device packages 310 are disposed.

The light emitting device package 310 in this embodiment may be the light emitting device package shown in FIG. 1 or 3.

In accordance with this embodiment, the plural light emitting device packages 310 are divided into first to fourth groups P1-P4, as shown in FIG. 7, and FIG. 7 illustrates the respective first to fourth groups P1-P4 as including two light emitting device packages 310 for convenience of description.

That is, at least one light emitting device package 310 forms an array, but the disclosure is not limited thereto.

The substrate 320 may be a printed circuit board (PCB), a flexible PCB, or a metal core PCB (MCPCB), and the PCB may be a single-sided PCB, a double-sided PCB or a PCB having a plurality of layers. Although this embodiment illustrates the single-sided PCB, the disclosure is not limited thereto.

With reference to FIG. 8, the substrate 320 may include a base layer 322, a copper foil layer 324, and an insulating layer 326.

Although this embodiment illustrates the substrate 320 as using the base layer 322 formed of FR4, the substrate 320 may be an MCPCB including at least one of aluminum (Al) and copper (Cu) and if the substrate 320 is the MCPCB, an insulating member (not shown) may be disposed between the base layer 322 and the copper foil layer 324, but the disclosure is not limited thereto.

The copper foil layer 324 supplying power to the light emitting device packages 310 may be disposed on the base layer 322.

Here, the copper foil layer 324 may include first and second patterns 324a and 324b electrically connected to first and second lead frames (not shown) of the light emitting device packages 310, and a connector pattern 324c of a connector terminal (not shown) on which a connector (not shown) is disposed.

The copper foil layer 324 may further include a connection pattern (not shown) connecting the first and second electrode patterns 324a and 324b and the connector pattern 324c.

The insulating layer 326 including at least one of a PSR ink and an insulating film to prevent corrosion and short of the copper foil layer 324 and to increase efficiency and reflectivity of light emitted from the light emitting device packages 310 may be disposed on the base layer 322 and the copper foil layer 324.

The insulating layer 326 may be provided with first and second electrode open areas 326a and 326b and a connector open area 326c through which the first and second electrode patterns 324a and 324b and the connector pattern 324c are exposed to the outside.

Although this embodiment illustrates the size of the insulating layer 326 as being equal to the size of the base layer 322, the size of the insulating layer 326 may be smaller than the size of the base layer 322 to prevent cracking or damage to edge parts of the insulating layer 326, but the disclosure is not limited thereto.

That is, the insulating layer 326 may have a sheet shape, and the first and second electrode open areas 326a and 326b and the connector open area 326c may be formed through an etching process.

Here, the first and second lead frames (not shown) of the light emitting device packages 310 and the connector may be disposed on the first and second electrode patterns 324a and 324b and the connector pattern 324c exposed through the first and second electrode open areas 326a and 326b and the connector open area 326c.

A cream solder (not shown) for electrical connection may be disposed between the first and second electrode patterns 324a and 324b and the connector pattern 324c exposed through the first and second electrode open areas 326a and 326b and the connector open area 326c and between the first and second lead frames (not shown) and the connector.

Figure 9:
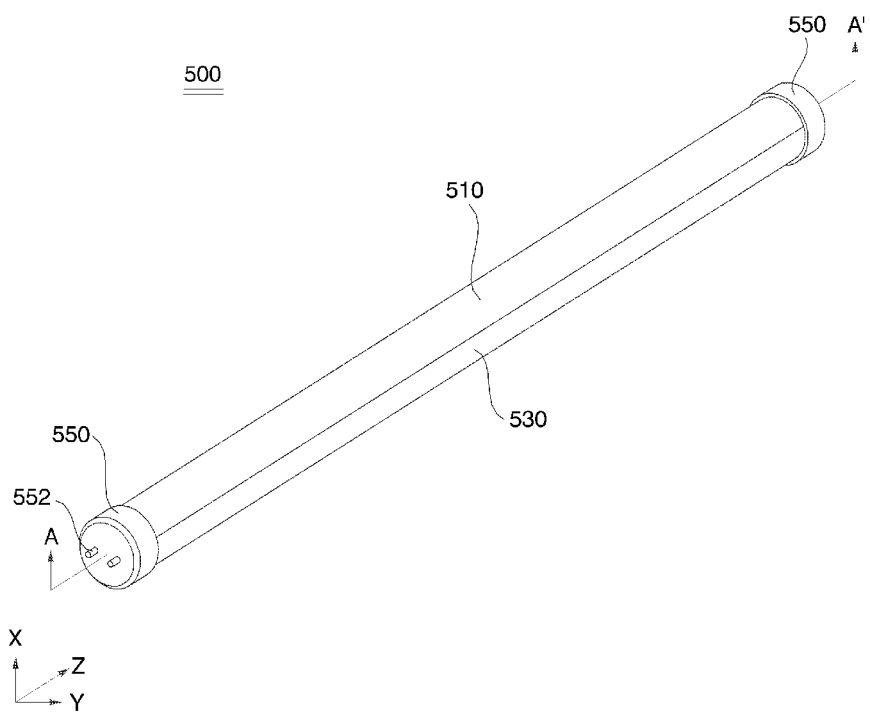
FIG. 9 is a perspective view illustrating a lighting apparatus including light emitting device packages in accordance with one embodiment.
Figure 10:
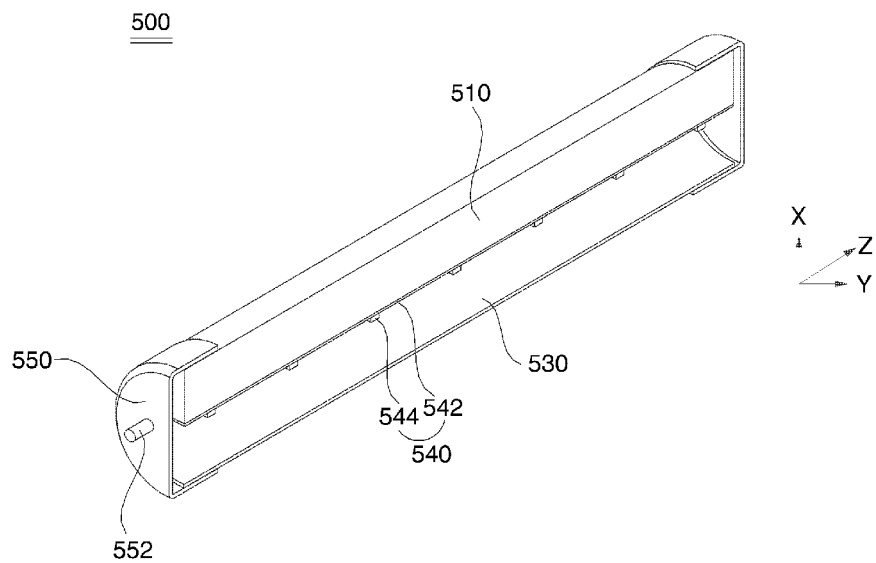
FIG. 10 is a cross-sectional view taken along the line A-A' of the lighting apparatus of FIG. 9.

FIG. 9 is a perspective view illustrating a lighting apparatus including light emitting device packages in accordance with one embodiment, and FIG. 10 is a cross-sectional view taken along the line A-A' of the lighting apparatus of FIG. 9.

Hereinafter, in order to illustrate the shape of a lighting apparatus 500 in accordance with this embodiment in more detail, a length direction Z of the lighting apparatus 500, a horizontal direction Y vertical to the lengthwise direction Z, and a height direction X vertical to the length direction Z and the horizontal direction Y will be described.

That is, FIG. 10 is a cross-sectional view obtained by cutting the lighting apparatus 500 of FIG. 9 along the planes in the length direction Z and the height direction X, as seen in the horizontal direction Y.

With reference to FIGS. 9 and 10, the lighting apparatus 500 includes a body 510, a cover 530 coupled to the body 510, and end caps 550 located at both ends of the body 510.

A light emitting device module 540 is coupled to the lower surface of the body 510, and the body 510 may be formed of a metal having excellent conductivity and heat dissipation effects so as to discharge heat generated by light emitting device module 540 to the outside through the upper surface of the body 510.

The light emitting device module 540 may include a light emitting device array (not shown) including the light emitting device packages 544 and a PCB 542 on which the light emitting device packages 544 emitting light of multiple colors are mounted in multiple rows. The light emitting device packages 544 may be mounted on the PCB 542 by the same interval or by various separation distances as needed, thereby being capable of adjusting brightness. As the PCB 542, a metal core PCB (MCPCB) or a PCB formed of FR4 may be used.

The cover 530 may be formed in a cylindrical shape to surround the lower surface of the body 510, but the disclosure is not limited thereto.

The cover 530 protects the light emitting device module 540 installed therein from external foreign substances. Further, the cover 530 may include light diffusing particles to prevent glare of light generated from the light emitting device packages 544 and to uniformly discharge light to the outside, and a prism pattern may be formed on at least one of the inner surface and the outer surface of the cover 530. Further, phosphors may be applied to at least one of the inner surface and the outer surface of the cover 530.

The cover 530 has excellent light transmittance so as to discharge light generated from the light emitting device packages 544 to the outside through the cover 530, and has sufficient heat resistance so as to withstand heat generated by the light emitting device packages 544. Therefore, the cover 530 may be formed of a material including polyethylene terephthalate (PET), polycarbonate (PC) or polymethylmethacrylate (PMMA).

The end caps 550 may be located at both ends of the body 510 and be used to seal a power supply device (not shown). Further, power pins 552 are formed on the end caps 550, and thus the lighting apparatus 500 in accordance with this embodiment may be attached to terminals, from which a conventional fluorescent lamp is removed, without a separate device.

Figure 11:
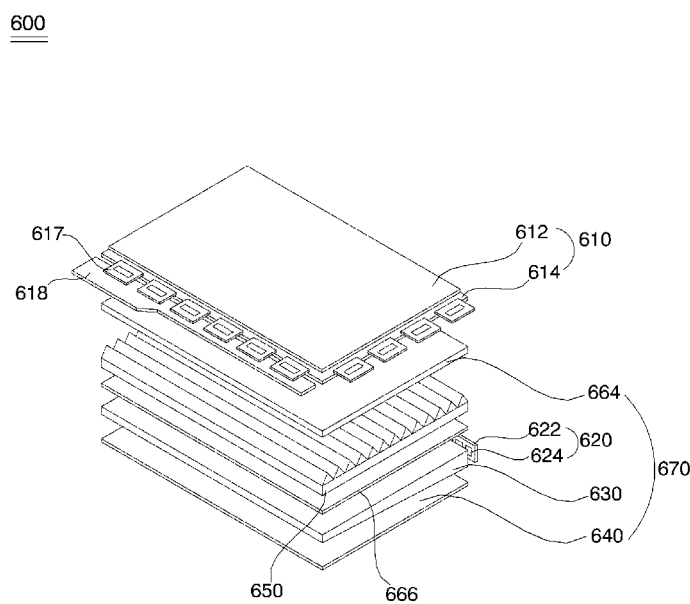
FIG. 11 is an exploded perspective view illustrating a liquid crystal display apparatus including light emitting device packages in accordance with one embodiment.

FIG. 11 is an exploded perspective view illustrating a liquid crystal display apparatus including light emitting device packages in accordance with one embodiment.

FIG. 11 illustrates an edge light type liquid crystal display apparatus 600, and the liquid crystal display apparatus 600 includes a liquid crystal display panel 610 and a backlight unit 670 to supply light to the liquid crystal display panel 610.

The liquid crystal display panel 610 may display an image using light supplied from the backlight unit 670. The liquid crystal display panel 610 may include a color filter substrate 612 and a thin film transistor substrate 614 disposed opposite each other under the condition that liquid crystals are interposed therebetween.

The color filter substrate 612 may produce color of the image displayed through the liquid crystal display panel 610.

The thin film transistor substrate 614 is electrically connected to a printed circuit board 618 on which a plurality of circuit parts is mounted through a drive film 617. The thin film transistor substrate 614 may apply drive voltage supplied from the printed circuit board 618 to the liquid crystals in response to a drive signal supplied from the printed circuit board 618.

The thin film transistor substrate 614 may include thin film transistors and pixel electrodes formed on a substrate formed of a transparent material, such as glass or plastic.

The backlight unit 670 includes a light emitting device module 620 outputting light, a optical panel 630 to convert light supplied from the light emitting device module 620 into surface light and then to supply the surface light to the liquid crystal display panel 610, a plurality of films 650, 664 and 666 to uniformize brightness distribution of light supplied from the optical panel 630 and to improve vertical incident properties, and a reflective sheet 640 to reflect light emitted from the rear surface of the optical panel 630 toward the optical panel 630.

The light emitting device module 620 may include a plurality of light emitting device packages 624, and a PCB 622 on which the plural light emitting device packages 624 are mounted to form an array.

Particularly, the light emitting device package 624 includes a film provided with a plurality of holes on a light emitting surface thereof, and may thus omit a lens, thereby having a slim structure and improving light extraction efficiency. Therefore, a thinner backlight unit 670 may be implemented.

The plural films 650, 664 and 666 of the backlight unit 670 may include a diffusion film 666 to diffuse light incident from the optical panel 630 toward the liquid crystal display panel 610, a prism film 650 to concentrate diffused light to improve vertical incident properties, and a protective film 664 to protect the prism film 650.

Figure 12:
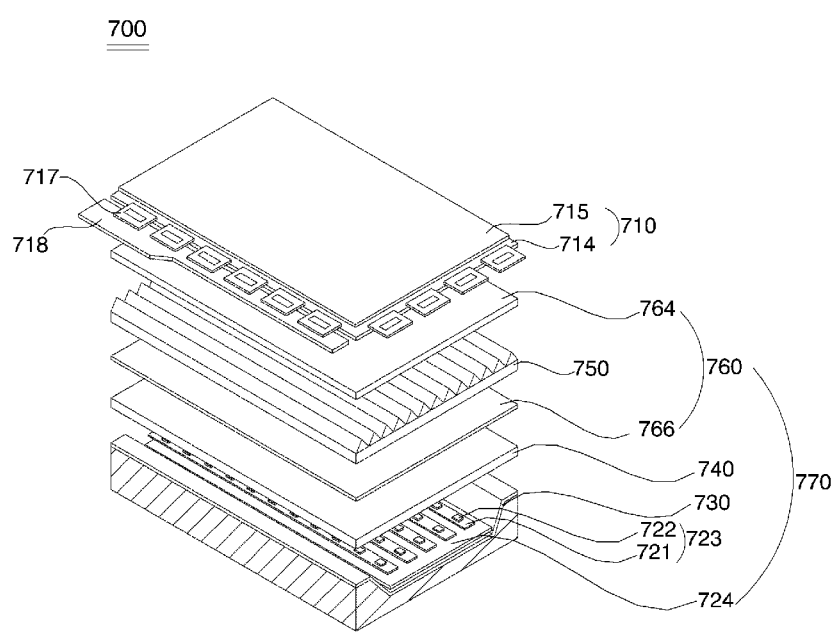
FIG. 12 is an exploded perspective view illustrating a liquid crystal display apparatus including light emitting device packages in accordance with another embodiment.

FIG. 12 is an exploded perspective view illustrating a liquid crystal display apparatus including light emitting device packages in accordance with another embodiment.

Here, a description of components of FIG. 12 which are substantially the same as those of FIG. 11 will be omitted.

FIG. 12 illustrates a direct type liquid crystal display apparatus 700, and the liquid crystal display apparatus 700 includes a liquid crystal display panel 710 and a backlight unit 770 to supply light to the liquid crystal display panel 710.

The liquid crystal display panel 710 is the same as the liquid crystal display panel 610 of FIG. 11, and a detailed description thereof will thus be omitted.

The backlight unit 770 may include a plurality of light emitting device modules 723, a reflective sheet 724, a bottom chassis 730 in which the light emitting device modules 723 and the reflective sheet 724 are received, a diffusion plate 740 disposed above the light emitting device modules 723, and a plurality of optical films 760.

The light emitting device module 723 may include a plurality of light emitting device packages 722, and a PCB 721 on which the plurality of light emitting device packages 722 is mounted to form an array.

The reflective sheet 724 reflects light emitted from the light emitting device packages 722 toward the liquid crystal display panel 710, thus improving light efficiency.

Light emitted form the light emitting device modules 723 is incident upon the diffusion plate 740, and the optical films 760 are disposed above the diffusion plate 740. The optical films 760 include a diffusion film 766, a prism film 750 and a protective film 764.

Here, lighting systems may include the lighting apparatus 500 and the liquid crystal display apparatuses 600 and 700, and may include other apparatuses including light emitting device packages and operated for the purpose of lighting.

As is apparent from the above description, a light emitting device package in accordance with one embodiment uses first and second adhesive members formed of the same material to adhere a light emitting device and a Zener diode to lead frames, thereby simplifying a fabrication process and reducing manufacturing costs.

Further, the light emitting device package in accordance with the embodiment uses a paste including at least one of gold (Au) and gold-tin (AuSn), thereby improving conductivity.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device package comprising:
   a Zener diode;
   a light emitting device including a light emitting diode;
   a body including lead frames on which the light emitting device and the Zener diode are disposed, and provided with a cavity formed on the lead frames;
   a first adhesive member provided between the Zener diode and the lead frames; and
   a second adhesive member provided between the light emitting device and the lead frames,
   wherein the thickness of the second adhesive member is smaller than the thickness of the first adhesive member.

2. The light emitting device package according to claim 1, wherein the first and second adhesive members are formed of the same conductive material.

3. The light emitting device package according to claim 1, wherein at least one of the first and second adhesive members includes at least one of gold (Au) and gold-tin (AuSn).

4. The light emitting device package according to claim 1, wherein the thickness of the second adhesive member is greater than 0.5 and less than 1 times the thickness of the first adhesive member.

5. The light emitting device package according to claim 1, wherein the second adhesive member contacts a portion of the side surface of the light emitting device.

6. The light emitting device package according to claim 1, wherein the first adhesive member contacts a portion of the side surface of the Zener diode.

7. The light emitting device package according to claim 1, wherein:
   the lead frames include first and second lead frames electrically connected to the light emitting device and the Zener diode, and separated from each other; and
   the light emitting device and the Zener diode are disposed on one of the first and second lead frames, or are separately disposed on the first and second lead frames.

8. The light emitting device package according to claim 1, wherein a recess in which at least one of the light emitting device and the Zener diode is disposed is formed on the lead frames.

9. The light emitting device package according to claim 8, wherein the depth of the recess is 1 to 2 times the thickness of the Zener diode.

10. The light emitting device package according to claim 8, wherein the depth of the recess is 0.3 to 0.8 times the thickness of the light emitting device.

11. The light emitting device package according to claim 1, further comprising a resin material filling the cavity,
    wherein the resin material includes at least one of phosphors, a light diffusing agent and a light dispersing agent.

12. The light emitting device package according to claim 1, wherein the thickness of the first adhesive member is varied according to the size and weight of the Zener diode and the thickness of the second adhesive member is varied according to the size and weight of the light emitting device.

13. A light emitting device package comprising:
    a Zener diode;
    a light emitting device including a light emitting diode;
    a body including a first lead frame on which the light emitting device is disposed and a second lead frame on which the Zener diode is disposed, and provided with a cavity formed on the first lead frame and the second lead frame;
    a first adhesive member provided between the Zener diode and the second lead frame; and
    a second adhesive member provided between the light emitting device and the first lead frame,
    wherein the thickness of the second adhesive member is smaller than the thickness of the first adhesive member, and
    wherein the light emitting device connected to the Zener diode in parallel.

14. The light emitting device package according to claim 13, wherein the Zener diode including a Zener substrate, a first semiconductor layer, a second semiconductor layer and a third electrode disposed on the second semiconductor, and
    wherein the Zener substrate may be adhered and fixed to the second lead frame by the second adhesive member.

15. The light emitting device package according to claim 14, wherein the a first semiconductor layer disposed on the Zener substrate and the second semiconductor layer disposed on the first semiconductor layer,
    wherein the third electrode is wire-bonded to the first lead frame.

16. The light emitting device package according to claim 13, wherein the second lead frame formed with a recess on which the Zener diode is disposed.

17. The light emitting device package according to claim 16, wherein the depth of the recess is 1 to 2 times the thickness of the Zener diode, or is 0.3 to 0.8 times the thickness of the light emitting device.

18. The light emitting device package according to claim 13, wherein the thickness of the first adhesive member is varied according to the size and weight of the Zener diode and the thickness of the second adhesive member is varied according to the size and weight of the light emitting device.

19. A light emitting device package comprising:
    a Zener diode;
    a light emitting device including a light emitting diode;
    a body including a first lead frame on which the light emitting device is disposed and a second lead frame on which the Zener diode is disposed, and provided with a cavity formed on the first lead frame and the second lead frame;
    a first adhesive member provided between the Zener diode and the second lead frame; and
    a second adhesive member provided between the light emitting device and the first lead frame,
    wherein the thickness of the second adhesive member is smaller than the thickness of the first adhesive member,
    wherein the width of the first adhesive member is equal to or greater than the width of the Zener diode, and
    wherein the width of the second adhesive member is equal to or greater than the width of the light emitting device.

20. The light emitting device package according to claim 19, wherein the thickness of the first adhesive member is varied according to the size and weight of the Zener diode and the thickness of the second adhesive member is varied according to the size and weight of the light emitting device.

* * * * *